United States Patent [19]

Schroeder et al.

[11] Patent Number: 5,113,580
[45] Date of Patent: May 19, 1992

[54] AUTOMATED CHIP TO BOARD PROCESS

[76] Inventors: Jon M. Schroeder, 14301 Bagdad Rd., Leander, Tex. 78641; Joseph F. Long, 1335 Los Creek Blvd., Austin, Tex. 78746; Randall J. Hartgrove, 390 2nd St., San Jose, Calif. 95112

[21] Appl. No.: 617,011

[22] Filed: Nov. 19, 1990

[51] Int. Cl.⁵ .............................. H05K 3/34
[52] U.S. Cl. ........................ 29/840; 29/827; 156/902; 174/52.5; 228/180.2; 437/209
[58] Field of Search ............ 29/827, 840; 156/902; 437/206, 209; 228/180.2, 173.1; 174/52.2

[56] References Cited

U.S. PATENT DOCUMENTS

| | | |
|---|---|---|
| Re. 31,114 | 12/1982 | Berg . |
| 3,832,769 | 9/1974 | Olyphant, Jr. et al. ........ 29/832 |
| 4,237,607 | 12/1980 | Ohno ........................ 29/840 |
| 4,330,812 | 5/1982 | Token . |
| 4,396,457 | 8/1983 | Bakermans ............... 156/902 X |
| 4,616,412 | 10/1986 | Schraeder . |
| 4,688,150 | 8/1987 | Peterson . |
| 4,927,491 | 5/1990 | Masaki ...................... 29/827 K |

OTHER PUBLICATIONS

IBM Technical Disclosure Bull vol. 24, No. 2 Jul. 1981, pp. 1214–1215 by L. V. Auletta et al.

Primary Examiner—Carl J. Arbes
Attorney, Agent, or Firm—Joseph F. Long

[57] ABSTRACT

The invention encompasses plating to form leads to allow one step bonding of a chip to tape; one step bonding of leads on the tape to a special chip package wherein chip packages may be stacked and connected as well as surface mounted and formation of a very dense circuitry on one or both sides of a board by using a photo imagable dielectric to separate circuitry and allow plating thru to form integral connections and edge connectors to connect circuitry to allow use of both sides of a board.

13 Claims, 5 Drawing Sheets

AUTOMATED CHIP TO BOARD PROCESS

BACKGROUND OF THE INVENTION

In the Electronics Industry quite commonly specialty businesses do various steps in the manufacturing and packaging of chips, in imaging, development and manufacturing of circuit boards and in mounting of components on a board. In a system of this type, maintaining proper inventory, transportation and communications are inherently difficult. Further much of the business is overseas because of lower cost labor. There is a need for an integrated process that may be automated to make labor cost a minor cost element Further there is an ever increasing need for greater component density on a circuit board allowing developments such as smaller more powerful lap-top computers.

This invention addresses the needs as outlined by uniquely modifying chip packaging and circuit board manufacture to use a high density circuitry with no thru hole connector and to allow simple in-process testing and machine mounting to mount any of a variety of chips in a package designed to allow stacking of multiple chips or to mount directly to the board. Both chip packaging and board manufacture are designed to minimize manual labor to essentially machine oversight.

Unique features include formation of metallic leads with gold being preferable that may be 0.5 mil. or smaller on tape with one end of the leads positioned for contacting a pad on a chip and the other end positioned for contacting rigid conductive contactors on a ceramic or plastic package with leads so positioned as to allow pressure mounting or thermocompression bonding of all leads at one time. Further the package design includes connectors and contactors so that with a simple solder dip the inputs and outputs from chips, or in chip packages stacked adjacent to each other, may be used. The circuit board is made with circuitry with leads as small as one mil. and as close as two mils. apart separated by a photoimagable plastic dielectric from closely packed circuitry running essentially transverse. The circuitry is integrally formed by electroplating. The double layer circuitry, as descried, may be used to form circuitry for mounting chips and components on either one or on both sides of the board. Edge connectors connect circuitry on each side of the board where needed. This design eliminates thru hole connectors with attendant problems and provides for greater component part board density by having one portion of essentially undirectional circuitry separated from another by a photoimageable plastic film thereby allowing connection by plating to circuitry that may be quite dense in a transverse direction. The board circuitry may be likened to struts laid out very close together wherein struts in one direction are separated from cross struts by insulators with connectors allowing one to change levels.

We have considered the following patents:

| Patent No. | Date | Inventor |
|---|---|---|
| 4,433,886 | 2/28/84 | J. W. Cassarly et al |
| 3,906,144 | 9/16/75 | David Wiley |
| 4,511,201 | 4/16/85 | Baker et al |
| 4,176,201 | 12/4/79 | L. D. Aldridge |
| 4,390,220 | 6/28/83 | J. E. Benassutte |
| 4,374,080 | 2/15/83 | Jon M. Schroeder |
| 4,449,690 | 5/22/84 | Jon M. Schroeder |
| 4,438,181 | 3/20/84 | Jon M. Schroeder |

-continued

| Patent No. | Date | Inventor |
|---|---|---|
| 4,616,412 | 10/14/86 | Jon M. Schroeder |
| 4,688,150 | 8/18/87 | R. K. Peterson |
| 4,330,812 | 5/18/82 | R. H. Token |
| 60-225,966 | 11/11/85 | K. K. Canon & Hideo Fushimato |
| 52-74637 | 1/23/79 | Nippon Denki and Akihiro Doutani |
| 3,335,371 | 8/8/67 | N. F. Damon et al |
| 4,164,003 | 8/7/79 | M. Cutchaw |
| RE 31,114 | 12/28/82 | W. E. Berg |
| 3,335,327 | 8/8/67 | N. T. Damon et al |
| 4,366,777 | 12/2/80 | J. F. Merlinu et al |
| 4,169,642 | 10/2/79 | Bob Mouissie |
| 4,166,665 | 9/4/79 | J. M. Cutchaw |
| 3,571,915 | 3/23/71 | F. A. Shirland |
| 4,494,688 | 1/22/85 | Hatada et al |
| Ser. No. 07/358,503 | 5/30/89 | Jon M. Schroeder |

SUMMARY OF THE INVENTION

This invention covers chip mounting and circuit board manufacture to allow using an automated system to put chips on an integrated circuit on a circuit board in the smallest space in a reliable manner.

A chip may be mounted in a ceramic package wherein electrically conductive connectors or contactors suitable for surface mounting are integral in the ceramic package. Further, the conductive connectors may be so structured that chips may be stacked and connectors joined by solder, conductive epoxy, etc.

To connect the pads of the chip with conductive connectors built in the package in one operation, leads on tape for a single chip or multiple chip package wherein leads from the chip may go directly to a package are formed as follows:

1) 0.7 mil. thick aluminum tape with punched holes for sprocket drive is coated with photoresist on both sides;
2) the photoresist on side A and side B is imaged, developed, and dissolved off and exposed aluminum on side A only is gold plated by floating on a plating bath to form leads 0.5 mil. by 0.5 mil. properly spaced to contact pads on a chip on one end and to contact electrical connectors on one half of a package on the other end;
3) a metal backed dimensionally stable tape such as Kapton or a polymide is pre-punched for sprocket drive and to form an opening for a chip that allows ends of the plated leads to be exposed and openings to allow ends of leads going to the package to be exposed. The tape is then coated with adhesive and properly positioned as it is rolled on top of the gold plated leads on side A using sprocket holes for proper alignment.
4) the area between and around the gold on aluminum leads and under the chip site has been imaged, dissolved off and exposed aluminum is now then chemically removed. In this step the aluminum on the ends of the leads is removed leaving a gold contact tip. In the imaging wider spots of gold on aluminum may be left under each lead for greater stability. Thus, we have a continuous stable film base backed with copper holding gold leads as close as one mil apart that have been adhesively connected to the film.

In a second embodiment it may be desireable to cross the leads going from the chip to the package in order to allow a particular package to fit on a known board. In this case a cross over connection on the underside of a tape may be made as follows:

1) starting with an aluminum tape coated on both sides with photoresist side A is imaged developed and gold plated to form leads to extend from chip site to package with cross over leads being discontinuous at point of crossing. Side B is imaged and developed to remove about a 3 to 10 mil spot to form a post exactly under each discontinuous end of the cross over lead or side A. A connecting lead more than 0.5 mil wide between the 3 mil posts is also imaged. At this point a dimensionally stable film, which may be metal backed with holes prepunched to allow exposure of the ends of leads going to chip site and ends of leads going to the package, is coated with an adhesive and rolled onto the top of the gold leads on side A. In some embodiments a segment larger than the leads is prepunched to allow exposure of the ends of the leads going to the chips site and ends going to a package and this segment may be used instead of a continuous tape.

Side B is then gold plated to form gold leads and gold caps on crossover posts and the remaining photoresist is removed to allow aluminum removal between leads on side A and under the chip site on side A. The time and severity of aluminum etching is just sufficient to remove the aluminum In this manner the 3 mil posts will be under cut but not removed while the aluminum under the cross over leads is totally removed. After washing and drying a quick setting non-conductive plastic is placed over each gold cross over lead to completely support the lead.

In a third embodiment it may be desireable to have chips in the same package with various cross over leads connecting chip to chip or chips to the package. With different art work for imaging, discontinuous leads on side A of a tape may be connected underneath on side B exactly as described for the second embodiment wherein a single chip with cross over leads is mountable.

In a fourth embodiment that is particularly useful where high frequency access to the chip is needed, essentially all the leads are gold plated and supported on posts as outlined. In this case the leads are not incapsulated in order to take advantage of the superior dielectric constant of air.

With leads on the tape formed as outlined chips may be mounted with thermocompression bonding of the gold leads to the chip pad and with thermocompression bonding of the other ends of these gold leads to the package or in some cases, directly to the board in the normal manner. The copper backing in the support tape is grounded to the chip package in the normal fashion. Chip pads are usually 4 mil in size and the gold leads made as we outlined to be approximately 0.5 mil wide and 0.5 mil to 1.0 mil thick depending upon plating should fit easily on pads that could be less than 1 mil wide. This change could allow improved smaller size chips to be made.

In other embodiments leads made from one of a group of metals comprising platinum, silver, gold or alloys thereof is used to form the metallic leads from the drip to the package connector.

In a a preferred embodiment chips with pads upward are supported within the under half of a ribbed chip package and the chip site of the tape is properly positioned and the ends of the gold leads around the chip site are thermocompression bonded to the chip. In other embodiments, the chip may be bonded to the tape before placing in the package. The ribbed chip package is formed with exterior ribs having a conductive strip on the outermost projection of each rib leading down to the package foot in such a manner as to be solderable to a lead on a board. The conductive strip extends over the top edge of the lower portion of the package to allow thermocompression bonding to leads from a chip.

The ribbed package is designed to fit closely over the chip and in a preferred embodiment an adhesive such as epoxy resin fills any void over and under the chip to facilitate heat transfer to the package. To facilitate heat transfer from package to the atmosphere the package may be slotted between the lower part of the ribs and metal such as copper may be embedded in both the top and bottom portion of the package. The preferable material of construction is ceramic although some dimensionally stable, filled, unplasticized plastics such as mineral filled epoxy or silicones should be suitable.

A circuit board assembled as follows allows very close mounting of the ceramic chip packages on both sides of the circuit board using special edge connectors so no thru hole connectors are necessary.

Starting with a polyimide or other stable board material which is usually purchased copper plated on both sides, a very dense circuit for surface mounting chips on one or both sides of the board is formed as follows:

1) protective ink traces are screened on where gross or major circuitry, component mounting, heat sinks, power bus, ground planes, edge connectors, etc., are desired on each side;
2) the unprotected copper plate is then chemically dissolved away;
3) the ink is removed;
4) a thin conductive layer such as a thin copper layer is applied on both sides of the board by evaporation or sputtering and coated with photoresist;
5) the photoresist is imaged and developed to allow copper plating of both major circuitry leads as small as one mil. and as close as 2 mils. apart along with other connectors; these leads may also connect with major circuitry already formed;
6) the board is now covered with hard photoimagable plastic such as a polyimide and areas to form connectors are imaged and developed off; the photoimagable plastic is then baked or set to render it non photoimageable and is then covered by vapor deposition to form a conductive copper layer;
7) a layer of photoresist is then placed on both sides of the board;
8) the photoresist is imaged to form a path for transverse circuitry and connectors to connect upper layer of dense circuitry to the lower layer;
9) the photoresist is developed or removed according to the patter or mask to allow plating fine line circuitry and connectors as imaged;
10) copper is then plated to the thin copper layer exposed to form fine line circuitry and connectors;
11) the remainder of the photoresist along with the thin copper layer below is removed;
12) a layer of photoimageable or screenable solder mask may be applied; thereby protecting fine line circuitry during subsequent assembly.

Using available or modified equipment, packaged chips may be mounted on both sides of the board. The packaged chips may be soldered in a conventional manner and edge connectors may be used to connect circuitry on either side of the board to complete assembly of chips and other components as provided for in the same manner as outlined for chips.

The total board and component connectors may be covered with a protective dielectric coating.

Since there are no thru hole connectors to the board material could include metals such as aluminum as well as the presently used materials such as polyimide, glass, fiberglass, etc. the use of aluminum coated with insulating layer could be advantageous both as a heat sink and for moderation of induced electrical effects.

We have outlined a tape made to have gold leads only bonding to a chip and then to a new ribbed package which then may be mounted on a mother board made so pins or through hole connectors are not necessary in order to be able to automate a very dense chip to board assembly.

DETAILED DESCRIPTION OF THE DRAWINGS

FIGS. 1, 2, 3, 4, and 5 all pertain to how a tape is formed for mounting single or dual chips in a single package with the ability to cross leads where desired.

Figure 1:
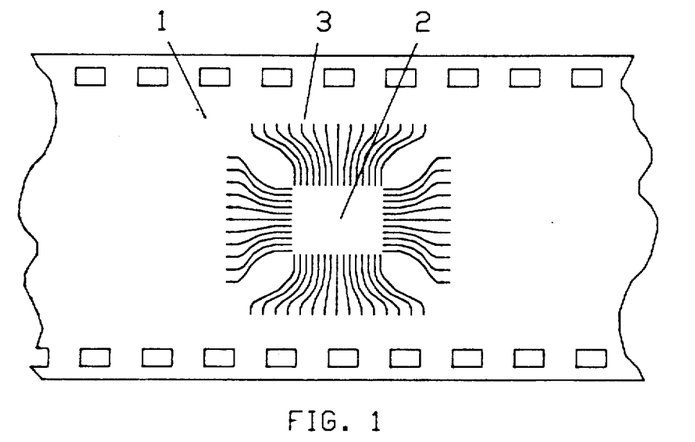
In FIG. 1 we show leads formed on photoresist covered aluminum tape with leads going from chip site to connect to conductive outlet connectors.

FIG. 1 shows leads 3 that are preferably gold only leading from chip site 2 outwardly to connect to a package. Leads as shown may be continuously made as follows:

a) aluminum tape 1, preferably 0.7 mil thick is coated on both sides with photoresist. The photoresist is imaged and developed on both sides simultaneously with side A imaged to uncover areas for leads preferably 0.5 mil wide and side B imaged to uncover chip sites 2 and areas between and under leads 3. The uncovered areas for leads 3 is gold plated to the aluminum below with gold plating being preferably a minimum of 0.5 mil thick.

Figure 2:
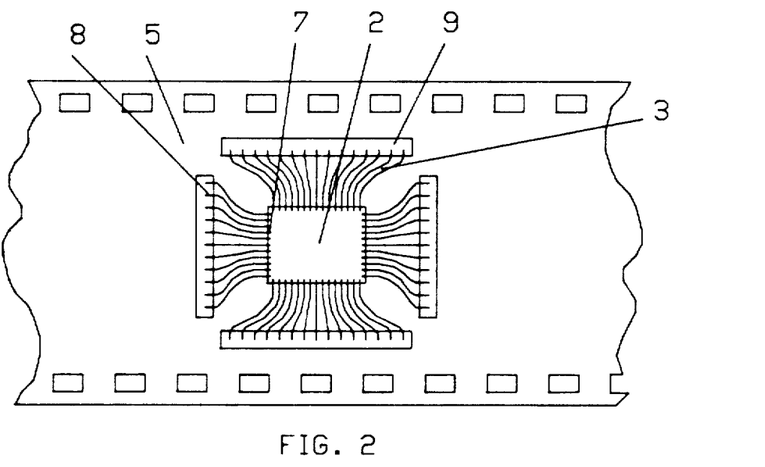
FIG. 2 shows top view of a metal backed support tape indicating cut out areas for a chip site and for connectors to end of leads from the chip to a package.

After plating with copper, nickel, silver, platinum or gold, but preferably of gold to form leads, approximately 0.5 mil by 0.5 mil thick, a prepunched metal backed plastic tape 5 is coated with adhesive and adhesively connected to side A of tape 1. Metal backing of tape 5 is preferably of copper but several other metals would be useable. Prepunching of tape 5 leaves an area for ends of gold plated on aluminum to extend into chip site 2. Other punched out areas leave uncovered tips of leads 3 to leave a tip projecting into the packaging site 9. The underlying aluminum under the previously imaged and developed area on Side B is etched away. In this manner gold leads 3 with photoresist between them are left adhering to and solidly supported by metal backed tape 5 with 0.5 by 0.5 mil gold tips 7 extending into the chip site area 2 and 0.5 by 0.5 mil gold tips 8 left extending into areas 9 for mounting to the package and aluminum under the chip site is removed.

Figure 3:
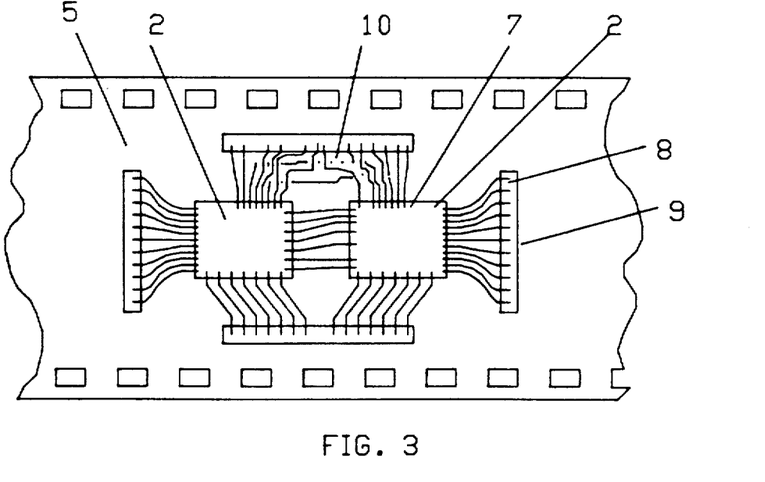
FIG. 3 shows dual chip site with cross over leads for a single dual chip package.

In FIG. 3 we show two chip sites with leads to connect chip to chip both directly and with leads crossed over each other. The two sites and leads are shown for an embodiment wherein two chips are mounted within one package. In this embodiment all the leads except cross over leads 10 and tape layers are formed as described for FIG. 1. Cross over leads 10 are depicted in top view in FIG. 4 and in side view in FIG. 5.

Figure 4:
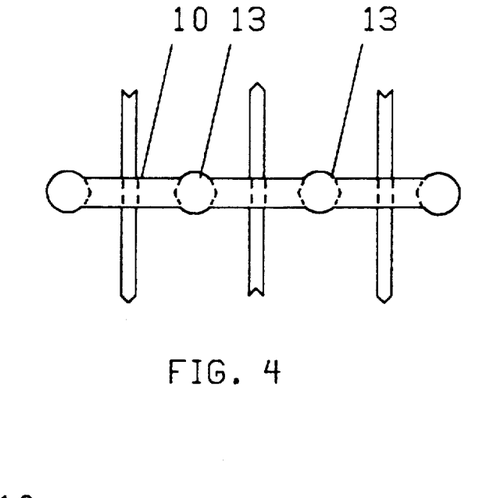
FIG. 4 shows top view of bridge posts for making cross over leads on tape.

In FIG. 4 we show side B as discussed under FIG. 1. Bridge posts 12 and support posts 13 to support cross over leads 10 are formed as follows:

a) cross over leads 10 are made on side B of the tape 1. FIG. 1 while leads 3 are made on side A with connectors being bridge posts 12 and the leads 10 are supported with support posts 13. Where any of leads 3 are to cross another lead 3 the lead formed on side A is discontinuous. Photoresist on side B is imaged to remove about a minimum of 3 to 10 mil spot just above each discontinuous end of lead 3 on side A and between leads 3 on side A and is further imaged to remove about a 0.5 mil width for lead 10 going between 3 mil spots. After removal of the image d area of the photoresist the tops of posts 12 and 13 and lead 10 are gold plated to a thickness of at least 0.5 mil. The photoresist under the chip site and under leads 3 is then removed as described under FIG. 1 and the 0.7 mil thick aluminum is etched away. This etching will remove all the aluminum under the 0.5 mil wide lead 10 but will leave an undercut aluminum post 12 connected to each discontinuous end of lead 3 on side A. In a preferred embodiment after cross over leads 10 and posts 12 and 13 are formed as outlined sufficient quick hardening non-conductive epoxy resin is added to encapsulate the cross over leads 10 to protect these leads from accidental breakage.

For very high frequency operation the major portion of all leads may be put on bridge posts and support posts as described. In this case the leads would not be epoxy encapsulated but would be left so as to make use of the superior dielectric constant of the air surrounding the leads.

Figure 5:
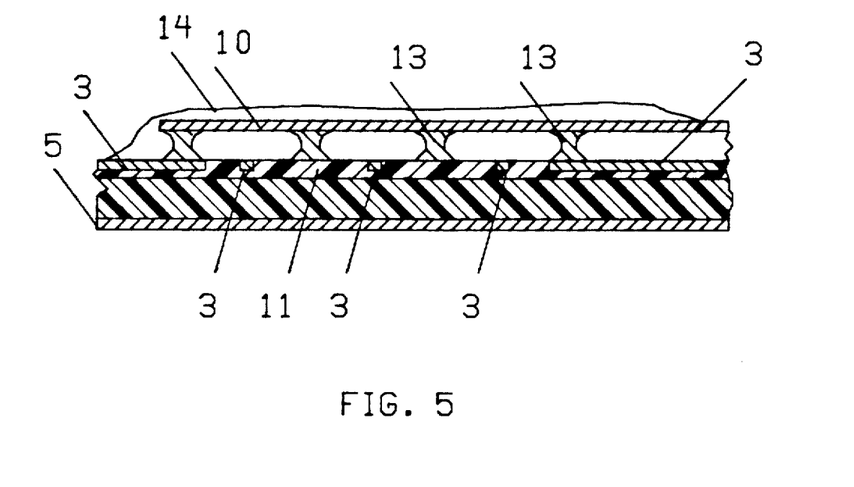
FIG. 5 shows detail of cross over lead formation on tape.

FIG. 5 shows a cross sectional side view of gold cross over lead 10 supported by bridge posts 12 which are connected with aluminum to discontinuous ends of lead 3 and cross over transverse leads 3. Support posts 13 will be held to metal backed tape 5 by adhesive 11.

Figure 6:
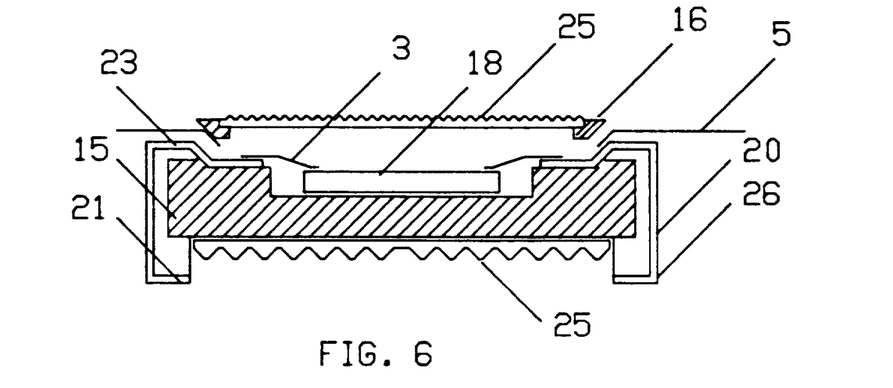
FIG. 6 shows a side view of a preferred ribbed chip package.
Figure 7:
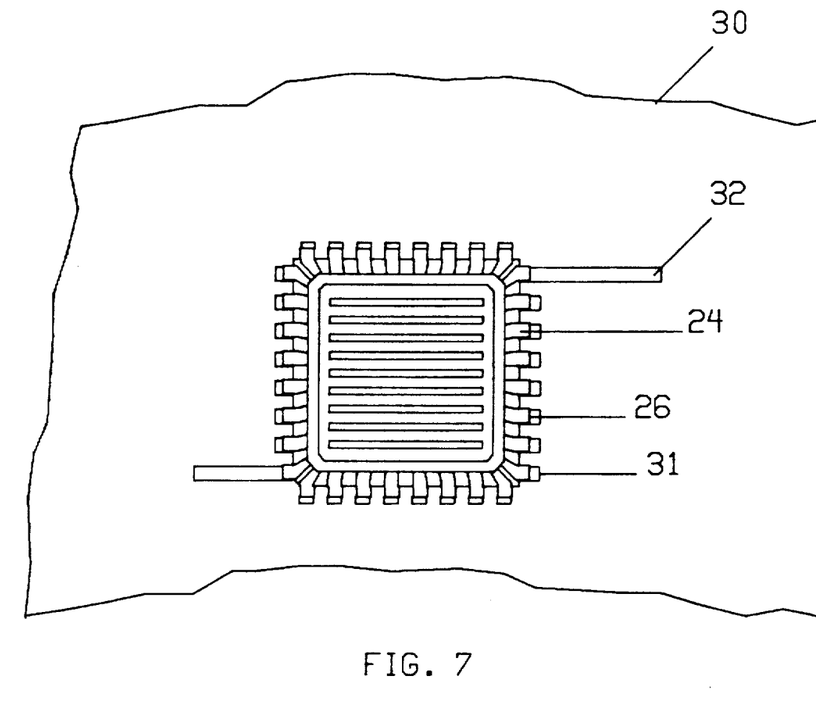
FIG. 7 shows a top view indicating ribs on the preferred chip package.

FIG. 6 and 7 depict special chip package to facilitate automatation of the chip to board package.

In FIG. 6 we show a section view of the special ribbed chip package 15 with cover 16. Chip 18 may be thermocompression bonded to gold lead tips o tape 5 before positioning in package 15 or chip 18 may be placed in package 15, anchored wit epoxy resin and then thermocompression bonded to gold lead tips on tape 15. Gold tips in area 9. FIG. 1 are then thermocompression bonded to conductive leads 20 formed on an outer edge of ribs 24 leading to slotted feet 21. A small amount of epoxy is then placed around the periphery of cap 16 and cap 15 then held firmly in place to bond to package 16. Cap 15 is shaped to facilitate thermocompression bonding of leads from the chip to conductive leads 20.

Package 15 and cover 16 are preferably made of ceramic. Conductive leads 20 may be made in any of several conventional ways including plating on conductive ink traces. Ribbed metal 25 is preferably included both in the cover 16 and the ribbed chip package 15 in order to improve heat dissipation. Lead connector 26 is shaped for easy solder connection to the circuit board wiring to connect to conductor leads 20 to allow stacking of the chip packages. With shape as shown circulation of air between chip packages is accelerated a the air heats from operation of the chip.

FIG. 7 shows the top view of ribs 24 ending in slotted feet 26 with the foot shaped to facilitate soldering of conductive lead 20. FIG. 6.

Figure 8:
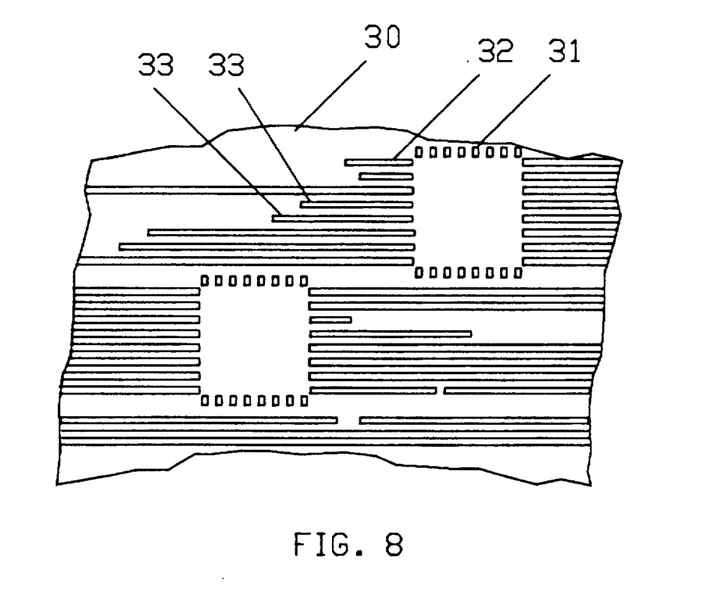
FIG. 8 shows gross circuitry and first layer of interconnection.
Figure 9:
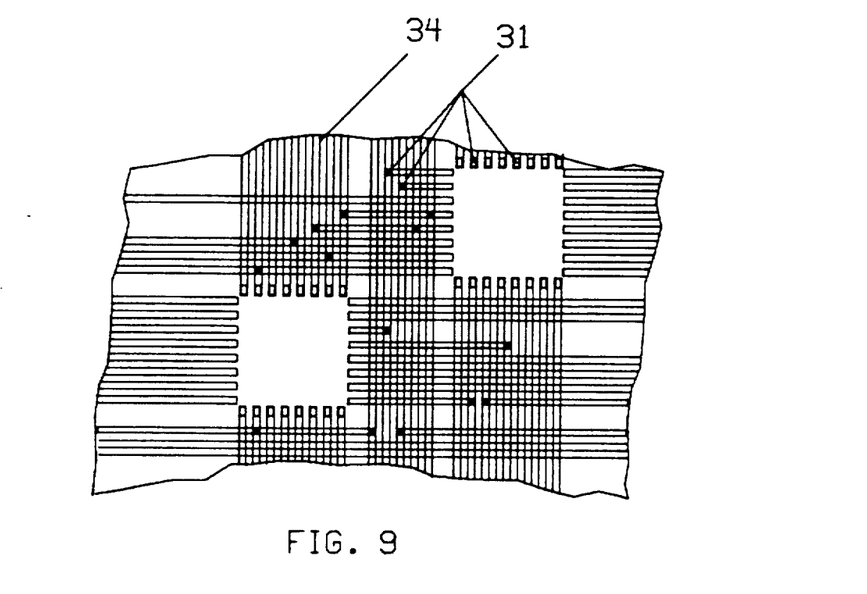
FIG. 9 shows both first and second layer of interconnection circuitry.
Figure 10:
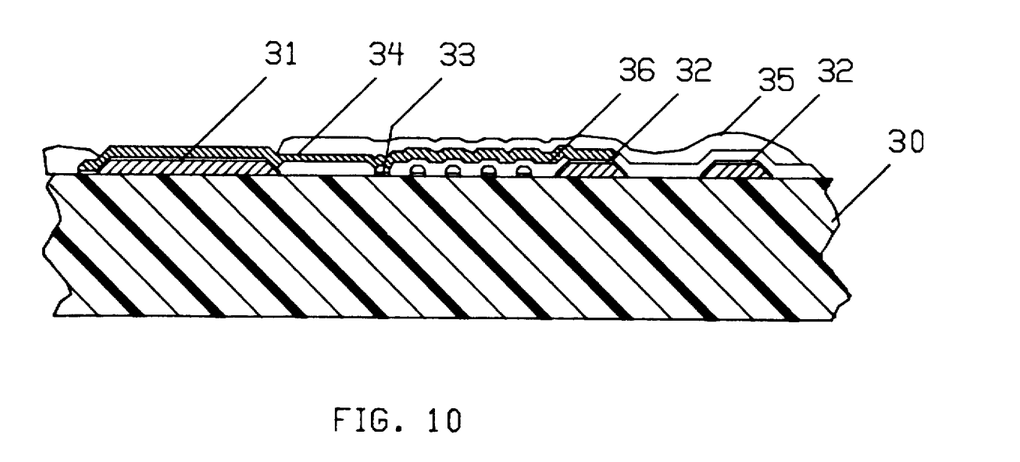
FIG. 10 shows a cross section indicating layers on a board.

FIGS. 8, 9 and 10 depict the manufacture of a special board designed to use no through hole connectors or pins.

In FIG. 8 we show busses and connecting points of gross circuitry. Starting preferably with an epoxy glass board 30 covered with 0.5 mil copper one or both sides of the board is covered with photoresist and the photoresist is imaged to form the gross or major circuitry normally at least 10 to 20 mil wide. The photoresist is developed and copper etched off to leave desired gross copper circuitry 32 including contact pads 31. To form the first layer of interconnecting circuitry 33 as shown in FIG. 8 the board 30 and gross circuitry 32 is covered with a very thin layer of copper by vapor deposition, sputtering etc. This layer of copper is then covered with photoresist which is then imaged with lines that may be greater than 0.5 mil wide. After development of photoresist the lines are metal plated, usually with copper to a thickness of greater than 0.5 mil. The remaining photoresist is chemically removed and the very thin layer of copper along with a very small thickness of the interconnecting circuitry 33 is etched off. Note that the interconnecting circuitry 33 may be plated to connect with contact pads 31 or other parts of gross circuitry 32. Also move contact pads 32 may be formed as the interconnecting circuitry 33 is formed. Although an epoxy glass goard is currently preferred a glass or even insulated metal board could be used as no through hole connections are used.

FIG. 9 shows both first layer of interconnecting circuitry 33 and second layer of interconnecting circuitry. The second layer of interconnecting circuitry 34 is formed by coating interconnecting circuitry 33 with a photoimageable photoresist such as polyimide that may be easily rendered non-photoimageable. This layer is then imaged and developed to leave openings over contact points in the gross circuitry 32 and/or contact pads 31. Note that either one or both sides of the board may be built up as described since no through hole connectors are used.

The photoresist is then rendered non-imageable, usually by heating and a thin layer of copper is vapor deposited over the entire surface. The surface is again covered with an easily removeable photoresist. The surface is then imaged for the second layer of interconnecting circuitry 33 and for through the layer connections to gross circuitry 32 and contact pads 31. The image is developed and metal plated to form the second layer of interconnecting circuitry 34 along with connections to conductor pads 31 and to interconnecting circuitry 33 and to gross circuitry 32. The photoresist is then removed and flash etching removes thin copper to separate the leads as formed. A solder mask layer may then be used to protect the leads.

FIG. 10 shows a section view of a board 30 showing layer of interconnecting circuitry 32 covered with hardened polyimide 36 that insulates second interconnecting circuitry layer 34 from first layer circuitry 33 except where connections are plated through as shown with connections to contact pad 31, gross circuitry 32 and first layer interconnecting circuitry 33. The completed circuitry is covered with protective solder mask layer 35.

Although we have shown circuitry as built up on only one side of board 30 it is obvious that similar circuitry could be also built up on the other side of the board and that commercially available edge connectors can be used to connect circuitry on two sides of the board.

Proceeding as previously outlined multiple layers of interconnecting circuitry may be built up.

Figure 11:
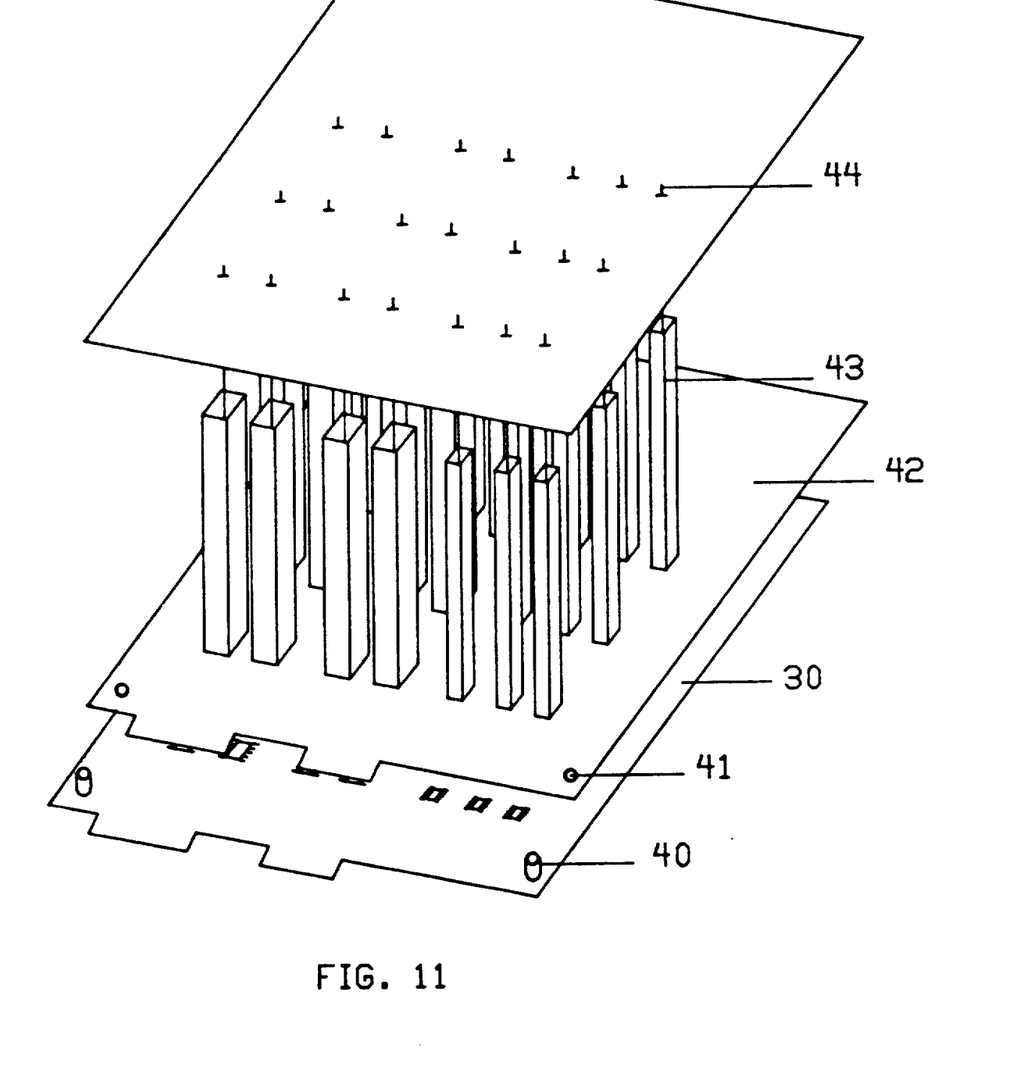
FIG. 11 shows a jig for feeding components to a board.

In FIG. 11 we depict a jig 42 that allows automatically pressure feeding individual components to board 30 through tubes 43. Posts 40 aligned with holes 41 hold the jig properly positioned above the board.

LEGEND

FIG. 1

1 = sprocket driven 0.7 mil aluminum tape
2 = chip site
3 = chip to package leads

FIG. 2

2 = chip site
3 = chip to package leads
5 = metal backed plastic tape
7 = metallic tips extending into chip site area
8 = metallic tips extending into package mounting area
9 = package mounting area

FIG. 3

2 = chip site
5 = metal backed plastic tape
7 = metallic tips into chip site
8 = metallic tips for package mounting
9 = packaging site
10 = crossover leads

FIG. 4

3 = lead
10 = crossover lead
12 = bridge posts
13 = support posts

FIG. 5

3 = leads
5 = metal backed tape
10 = crossover leads
11 = adhesive
12 = bridge posts
13 = support posts
14 = epoxy incapsulation

FIG. 6

5 = metal backed tape
15 = ribbed chip package
16 = cover
18 = chip
20 = conductive lead
21 = ribbed foot
24 = ribs
25 = ribbed metal
26 = lead connector

FIG. 7

24 = ribs
26 = lead connector
30 = board
31 = contact pad
32 = gross circuitry such as a bus

FIG. 8

30 = board
31 = contact pads
32 = gross circuitry
33 = interconnecting circuitry—first layer

FIG. 9

34 = the second layer of interconnecting circuitry
31 = pads to connect first layer and second layer circuitry

FIG. 10

30 = board
31 = contact pads
32 = gross circuitry
33 = first layer of interconnecting circuitry
34 = second layer of interconnecting circuitry
35 = solder mask protection layer
36 = hardened to be non-photoimageable insulator such as polyimide

FIG. 11

30 = board
40 = positioning post
41 = positioning hole
42 = jig
43 = jig tube
44 = pressuring device

What is claimed is:

1. An automated chip to circuit board process comprising:
    1) placing ribbed packaged chip means with solid output-input means on a multiple circuitry layer integrated circuit means on a circuit board;
    2) pressuring said ribbed packaged chip means to contact pads on said multiple circuitry layer integrated circuit means;
    3) soldering an electrically conductive connector means on each rib of said ribbed packaged chip means to pads in said multiple circuitry layer integrated circuit means;
    4) feeding multiple component means to proper locations on said circuit board and soldering said multiple component means to said multiple circuitry layer integrated circuit means.

2. An automated chip to circuit board process as in claim 1 wherein each of said ribbed packaged chip means comprises multiple metallic leads on a tape means, with each end of said metallic leads being positioned on said tape so that a first end may contact a pad on a chip and a second end may contact said electrically conductive connector means on said ribbed chip package means with each of said first end of said multiple metallic leads then being bonded to said pad on said chip and with each of said second ends of said metallic loads being bonded to one of said electrical connector means on said chip package, said metallic leads being formed from a metal chosen from a group consisting of gold, silver, and platinum.

3. An automated chip to circuit board process as in claim 2 wherein said first ends of all of said metallic leads are connected to said chip in one operation and wherein said second end may be connected to said electrically conductive connector means of one of said ribbed packaged chip means in a second operation.

4. An automated chip to circuit board process as in claim 1 wherein said multiple circuitry layer integrated circuit means comprises copper leads for busses, component connectors, edge connectors and solder pads for component mounting and a first layer of copper leads as small as one mil wide and two mils apart essentially undirectional in said integrated circuit means and a second layer of copper leads separated by an insulating plastic layer from said first layer of copper leads but plated thru to form integral connections where desired with said bus, said component connectors, said edge connectors, said solder pads and with said first layer of copper leads, thereby forming said multiple circuitry layer integrated circuit means.

5. An automated chip to circuit board process as in claim 1 wherein said electrically conductive connector means of said ribbed packaged chip means are shaped so as to allow soldering one of said ribbed packaged chip means to said pads and are also so shaped that multiples of said ribbed packaged chip means may be stacked together with said electrically conductive connector means being connected to each other by a conductive material means.

6. An automated chip to circuit board process as in claim 1 wherein said ribbed package means comprises:
    a) a lower ribbed chip package with each rib leading to a foot with slots between a portion of said each rib extending below a body of said ribbed chip package and with conductive leads on an outer surface of said each rib; said conductive leads going from a flat upper surface down to and over said foot;
    b) a first ribbed metal piece embedded in said body with ribs of said first ribbed metal piece extending between said portion of said ribs extending below said body; said body having a cavity sized to receive a minimum of one chip;
    c) a minimum of one chip mounted on circuitry on a tape means with metallic leads in circuitry of said circuitry on a tape means being located to be bonded to an end of said conductive leads on said flat upper surface;
    d) a cover for said lower ribbed chip package with said cover having ribs with conductive leads on said ribs positioned to be solderable to said conductive leads on said lower ribbed chip package;
    e) a second ribbed metal piece embedded in said cover with ribs of said second ribbed metal piece extending less than an outer periphery of said cover.

7. An automated chip to circuit board process as in claim 6 wherein a method for forming said circuitry on a tape means comprises:
 a) coating each side of an aluminum tape with photoresist, imaging, and developing said photoresist on both a first and second side of said aluminum tape to expose first and second selected areas on said aluminum tape;
 b) plating said first selected areas of said aluminum tape to 0.5 to 1 mil thickness to form metal on aluminum leads spaced so that a first end of each of said metal on aluminum leads may contact said pad on a chip and a second end may contact said electrically conductive connector means of each of said ribbed packaged chip means;
 c) connecting adhesively a metal backed plastic tape with openings for leads to a chip site and for leads to a packaging site to adhere to said metal on aluminum leads and remaining photoresist on said first side of said aluminum tape;
 d) etching off aluminum of said second side of said aluminum tape in selected areas wherein aluminum between and under said metal on aluminum leads is removed and wherein said aluminum under both said first end and said second end of said gold plated on aluminum leads is removed and wherein aluminum under a chip site is removed thereby allowing a first end of gold leads to extend into said chip site and allowing a second end of said gold leads to extend into said package site.

8. An automated chip to circuit board process as in claim 6 wherein said circuitry on a tape means may be made as follows:
 a) coating both sides of an aluminum tape that may be less than 1 mil thick with photoresist;
 b) imaging said photoresist on both a first and second side with aligned marks to form leads on said first side that run from a chip site to a package site and leads that run from a first chip site to a second chip site and leads that may cross other leads hereinafter called crossover leads; said crossover leads being discontinuous on said first side;
 c) developing said photoresist and plating said first side to form metallic leads less than 0.6 mil thick on aluminum on said first side;
 d) covering said first side of said aluminum tape with an adhesive covered stable plastic nonconductive tape backed with a metal with openings in said nonconductive tape for chip sites and for packaging sites and for a sprocket drive;
 e) etching said second side of said aluminum tape to remove aluminum in areas exposed by imaging and developing said photoresist in said second side; said areas being circular areas approximately 10 mil in diameter under and also between each discontinuous end of said crossover leads on said first side and in areas a minimum approximately 0.5 mil wide between two of said circular areas under said discontinuous ends to form said crossover leads;
 f) plating with metal to a minimum of 0.5 mil thick to form said crossover leads attached to metal on said circular areas;
 g) etching away aluminum under said metal on aluminum leads, under said chip sites and under crossover leads; said etching away being only vigorous enough to remove less than 1 mil thick aluminum thereby removing all aluminum under said metal leads but leaving undercut aluminum posts to support said crossover leads;

9. An automated chip to circuit board process as in claim 9 further comprising supporting said crossover leads by encapsulating in a quick setting nonconductive plastic.

10. An automated chip to circuit board process as in claim 1 wherein method for manufacturing said integrated circuit means on said circuit board comprises:
 a) placing a photoresist coating on a minimum of one side of said circuit board, said circuit board being copper coated on a minimum of one side;
 b) screening protective ink on first selected areas to form busses, connectors, edge connector pads and solder pads of said integrated circuit means on said circuit board;
 c) stripping off copper where not protected by said protective ink;
 d) cleaning off said protective ink;
 e) vapor plating a thin but conductive copper layer over said minimum of one side of said circuit board;
 f) covering again said minimum of one side of said circuit board with photoresist; imaging selective areas to form openings for first layer leads a minimum of 2 mils apart and 1 mil wide; removing said photoresist in said selective areas and copper plating said selective areas to form said first layer leads;
 g) removing remaining photoresist and said thin but conductive copper layer;
 h) covering said minimum of one side of said circuit board with a photoimageable plastic that may be rendered a non-photoimageable plastic by heating and imaging, developing off areas to allow connection to said busses, said connectors, said edge connectors, and said solder pads; and heating to render remainder of said photoimageable plastic non-imageable and thereafter vapor copper plating;
 i) covering said non-photoimageable plastic on said minimum of one side of said circuit board with photoresist, imaging, and developing to form an area for second layer of leads a minimum of 2 mil apart and 1 mil wide and copper plating to form leads to connect said first layer of leads to said first busses, to said connectors, to said edge connector pads and to said solder pads;
 j) removing remaining photoresist and dissolving off said vapor copper plating;
 k) covering said minimum of one side with a solder mask protection layer.

11. An automated chip to circuit board process comprising:
 a) forming a tape for mounting one or more chips in a ribbed chip package means with leads that may cross over each other with a first end of said metal leads being positioned to be bonded to pads on said one or more chip in one operation and a second end of said metal leads being positioned to be bonded to connectors on said ribbed chip package means in a second operation;
 b) mounting chips in said ribbed chip package means using said tape;
 c) forming an integrated circuit board and soldering said connectors on said ribbed chip package means to pads connecting with circuitry on said integrated circuit board.

12. An automated chip to circuit board process as in claim 1 wherein material in said circuit board is one chosen from a group comprising aluminum, glass, polyimide resin, epoxy resin, fiberglass in epoxy resin, and aluminum alloy.

13. An automated chip to circuit board process as in claim wherein said ribbed package means comprises:
 a) a ceramic package with essentially rectangular shape with multiple ribs extending from each side leading down to a foot with a lower chip receiving portion of said ceramic chip package being closed with a cover;
 b) conductors on each rib leading from said foot to form a conductor on said chip receiving portion;
 c) a ribbed metal conductor embedded in a top portion of said cover and a second ribbed metal conductor embedded in said lower chip receiving portion.

* * * * *